United States Patent
Zhang

(10) Patent No.: US 9,583,643 B2
(45) Date of Patent: Feb. 28, 2017

(54) SCHOTTKY STRUCTURE EMPLOYING CENTRAL IMPLANTS BETWEEN JUNCTION BARRIER ELEMENTS

(71) Applicant: Cree, Inc., Durham, NC (US)

(72) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/082,888

(22) Filed: Mar. 28, 2016

(65) Prior Publication Data
US 2016/0211387 A1 Jul. 21, 2016

Related U.S. Application Data

(62) Division of application No. 13/686,119, filed on Nov. 27, 2012, now Pat. No. 9,318,624.

(51) Int. Cl.
| | |
|---|---|
| H01L 29/15 | (2006.01) |
| H01L 29/872 | (2006.01) |
| H01L 29/47 | (2006.01) |
| H01L 29/66 | (2006.01) |
| H01L 29/06 | (2006.01) |
| H01L 29/16 | (2006.01) |

(52) U.S. Cl.
CPC ........ *H01L 29/872* (2013.01); *H01L 29/0619* (2013.01); *H01L 29/0684* (2013.01); *H01L 29/1608* (2013.01); *H01L 29/47* (2013.01); *H01L 29/6606* (2013.01)

(58) Field of Classification Search
None
See application file for complete search history.

(56) References Cited

U.S. PATENT DOCUMENTS

2005/0139947 A1 6/2005 Okada et al.
2012/0256192 A1 10/2012 Zhang et al.

FOREIGN PATENT DOCUMENTS

| JP | H11274521 A | 10/1999 |
| JP | 2000077682 A | 3/2000 |
| JP | 2006186134 A | 7/2006 |

OTHER PUBLICATIONS

International Search Report for PCT/US2013/070994, mailed Jan. 31, 2014, 15 pages.
International Preliminary Report on Patentability for PCT/US2013/070994, mailed Jun. 11, 2015, 9 pages.
Non-Final Office Action for U.S. Appl. No. 13/686,119, mailed Apr. 28, 2015, 7 pages.
Notice of Allowance for U.S. Appl. No. 13/686,119, mailed Dec. 15, 2015, 7 pages.
Notice of Preliminary Rejection for Korean Patent Application No. 10-2015-7016845, mailed Aug. 22, 2016, 11 pages.

*Primary Examiner* — Marvin Payen
(74) *Attorney, Agent, or Firm* — Anthony J. Josephson

(57) ABSTRACT

The present disclosure relates to a Schottky diode having a drift layer and a Schottky layer. The drift layer is predominantly doped with a doping material of a first conductivity type and has a first surface associated with an active region. The Schottky layer is provided over the active region of the first surface to form a Schottky junction. A plurality of junction barrier elements are formed in the drift layer below the Schottky junction, and a plurality of central implants are also formed in the drift layer below the Schottky junction. In certain embodiments, at least one central implant is provided between each adjacent pair of junction barrier elements.

20 Claims, 7 Drawing Sheets

SCHOTTKY STRUCTURE EMPLOYING CENTRAL IMPLANTS BETWEEN JUNCTION BARRIER ELEMENTS

RELATED APPLICATIONS

This application is a divisional of U.S. patent application Ser. No. 13/686,119, filed Nov. 27, 2012, now U.S. Pat. No. 9,318,624, the disclosure of which is hereby incorporated herein by reference in its entirety.

FIELD OF THE DISCLOSURE

The present disclosure relates to semiconductor devices, and in particular to employing central implants between junction barrier elements along a Schottky interface.

BACKGROUND

A Schottky diode takes advantage of a metal-semiconductor junction, which provides a Schottky barrier and is created between a metal layer and a doped semiconductor layer. For a Schottky diode with an N-type semiconductor layer, the metal layer acts as the anode, and the N-type semiconductor layer acts as the cathode. In general, the Schottky diode acts like a traditional p-n diode by readily passing current in the forward-biased direction and blocking current in the reverse-biased direction. The Schottky barrier provided at the metal-semiconductor junction provides two unique advantages over p-n diodes. First, the Schottky barrier is associated with a lower barrier height, which correlates to lower forward voltage drops. As such, a smaller forward voltage is required to turn on the device and allow current to flow in a forward-biased direction. Second, the Schottky barrier generally has less capacitance than a comparable p-n diode. The lower capacitance translates to higher switching speeds than p-n diodes. Further, Schottky diodes are majority carrier devices and do not exhibit minority carrier behavior, which results in switching losses.

Unfortunately, Schottky diodes have traditionally suffered from relatively low reverse-biased voltage ratings and high reverse-biased leakage currents. In recent years, Cree, Inc. of Durham, N.C., has introduced a series of Schottky diodes that are formed from silicon carbide substrates and compatible epitaxial layers. These devices have and continue to advance the state of the art by increasing the reverse-biased voltage ratings, lowering reverse-biased leakage currents, and increasing forward-biased current handling. However, there remains a need to further improve Schottky device performance as well as reduce the cost of these devices.

SUMMARY

The present disclosure relates to a Schottky diode having a drift layer and a Schottky layer. The drift layer is predominantly doped with a doping material of a first conductivity type and has a first surface associated with an active region. The Schottky layer is provided over the active region of the first surface to form a Schottky junction. A plurality of junction barrier elements are formed in the drift layer below the Schottky junction, and a plurality of central implants are also formed in the drift layer below the Schottky junction. In certain embodiments, at least one central implant is provided between each adjacent pair of junction barrier elements.

The Schottky layer may be formed from a low barrier height material, such as titanium, chromium, polysilicon, aluminum, or any other suitable material. An even lower barrier height material, such as tantalum, works extremely well with a drift layer formed from silicon carbide. The central implants and the junction barrier elements generally extend into the drift layer to differing depths. In one embodiment, the central implants have a depth that is no greater than about one-half of the depth of each of the junction barrier elements. In another embodiment, the junction barrier elements are at least four times deeper than each of the plurality of central implants.

In certain embodiments, the first surface of the drift layer has numerous junction barrier element recesses formed in the active region, such that at least certain junction barrier elements of the plurality of junction barrier elements are doped regions that extend into the drift layer about corresponding ones of the plurality of junction barrier element recesses. The doped regions are doped with a doping material of a second conductivity type, which is opposite the first conductivity type.

Further, a buffer region may be provided in a top portion of the drift layer. The buffer region is doped with the doping material of the first conductivity type at a higher concentration than a remaining lower portion of the drift layer, and both the central implants and the junction barrier elements reside in the buffer region.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
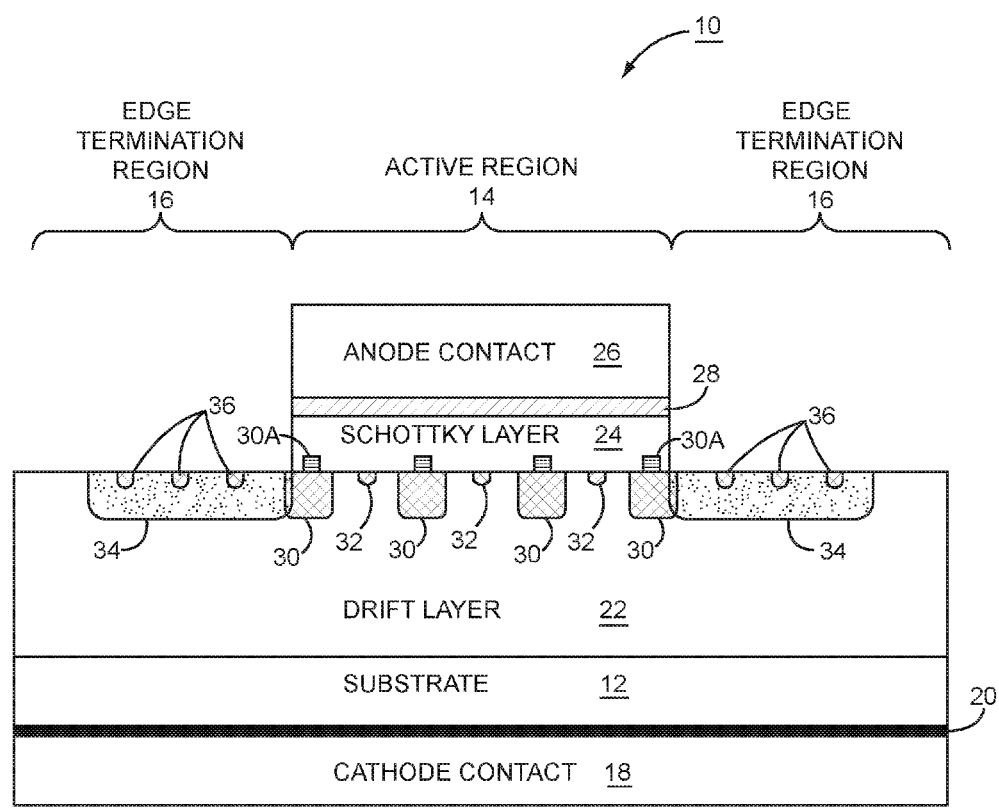
FIG. 1 is a cross-sectional view of a Schottky diode according to a first embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure relates to a Schottky diode having a drift layer and a Schottky layer. The drift layer is predominantly doped with a doping material of a first conductivity type and has a first surface associated with an active region. The Schottky layer is provided over the active region of the first surface to form a Schottky junction. A plurality of junction barrier elements are formed in the drift layer below the Schottky junction, and a plurality of central implants are also formed in the drift layer below the Schottky junction. In certain embodiments, at least one central implant is provided between each adjacent pair of junction barrier elements.

The Schottky layer may be formed from a low barrier height material, such as titanium, chromium, polysilicon, and aluminum. An even lower barrier height material, such as tantalum, works extremely well with a drift layer formed from silicon carbide. The central implants and the junction barrier elements generally extend into the drift layer to differing depths. In one embodiment, the central implants have a depth that is no greater than about one-half of the depth of each of the junction barrier elements. In another embodiment, the junction barrier elements are at least four times deeper than each of the plurality of central implants.

In certain embodiments, the first surface of the drift layer has numerous junction barrier element recesses formed in the active region, such that at least certain junction barrier elements of the plurality of junction barrier elements are doped regions that extend into the drift layer about corresponding ones of the plurality of junction barrier element recesses. The doped regions are doped with a doping material of a second conductivity type, which is opposite the first conductivity type.

Further, a buffer region may be provided in a top portion of the drift layer. The buffer region is doped with the doping material of the first conductivity type at a higher concentration than a remaining lower portion of the drift layer, and both the central implants and the junction barrier elements reside in the buffer region.

An exemplary Schottky diode 10 is provided in association with FIG. 1. Notably, the embodiments described herein reference various semiconductor layers or elements therein as being doped with an N-type or P-type doping material. Being doped with an N-type or P-type material indicates that the layer or element has either an N-type or P-type conductivity, respectively. N-type material has a majority equilibrium concentration of negatively charged electrons, and P-type material has a majority equilibrium concentration of positively charged holes. The doping concentrations for the various layers or elements may be defined as being lightly, normally, or heavily doped. These terms are relative terms intended to relate doping concentrations for one layer or element to those for another layer or element.

Further, the following description focuses on an N-type substrate and drift layer being used in a Schottky diode; however, the concepts provided herein are equally applicable to Schottky diodes with P-type substrates and drift layers. As such, the doping charge for each layer or element in the disclosed embodiments may be reversed to create Schottky diodes with P-type substrates and drift layers. Further, any of the layers described herein may be formed from one or more epitaxial layers using any available technique, and additional layers that are not described may be added between those described herein without necessarily departing from the concepts of the disclosure.

As illustrated, the Schottky diode 10 is formed on a substrate 12 and has an active region 14 that resides within an edge termination region 16 that may, but does not need to, completely or substantially surround the active region 14. Along the bottom side of the substrate 12, a cathode contact 18 is formed and may extend below both the active region 14 and the edge termination region 16. A cathode ohmic layer 20 may be provided between the substrate 12 and the cathode contact 18 to facilitate a low impedance coupling therebetween. A drift layer 22 extends along the top side of the substrate 12. The drift layer 22, the cathode contact 18, and the cathode ohmic layer 20 may extend along both the active region 14 and the edge termination region 16.

In the active region 14, a Schottky layer 24 resides over the top surface of the drift layer 22, and an anode contact 26 resides over the Schottky layer 24. A barrier layer 28 may be provided between the Schottky layer 24 and the anode contact 26 to prevent materials from one of the Schottky layer 24 and the anode contact 26 from diffusing into the other. Notably, the active region 14 substantially corresponds to the region where the Schottky layer 24 of the Schottky diode 10 resides over the drift layer 22. For purposes of illustration only, assume the substrate 12 and the drift layer 22 are silicon carbide (SiC). Other materials for these and other layers are discussed further below.

In the illustrated embodiment, the substrate 12 is heavily doped and the drift layer 22 is relatively lightly doped with an N-type material. The drift layer 22 may be substantially uniformly doped or doped in a graded fashion. For example, doping concentrations of the drift layer 22 may transition from being relatively more heavily doped near the substrate 12 to being more lightly doped near the top surface of the drift layer 22 that is proximate the Schottky layer 24, and vice versa Doping details for various exemplary embodiments are provided further below.

Beneath the Schottky layer 24, a plurality of junction-barrier (JB) elements 30 are provided along the top surface of the drift layer 22. Further, unique elements, which are referred to as central implants 32, are also provided along the top surface of the drift layer 22. As illustrated, a central implant 32 is provided between each pair of adjacent JB elements 30. Typically, the cross-section of the central implants 32 is substantially smaller than the cross-section of the JB elements 30, as depicted in FIG. 1. Heavily doping select regions in the drift layer 22 with P-type material forms both the JB elements 30 and the central implants 32. As such, each JB element 30 and central implant 32 extends from the top surface of the drift layer 22 into the drift layer 22. Together, the JB elements 30 and the central implants 32 form a JB array.

Figure 3:
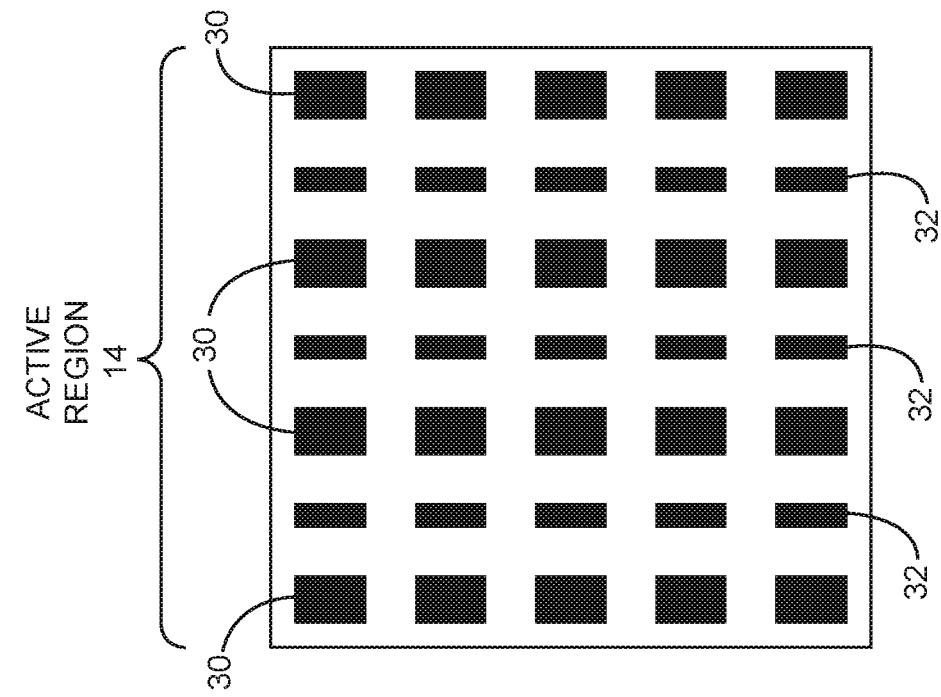
FIG. 3 is a top view of an active region of the Schottky diode, without the Schottky layer and anode contact, according to another embodiment of the disclosure.
Figure 2:
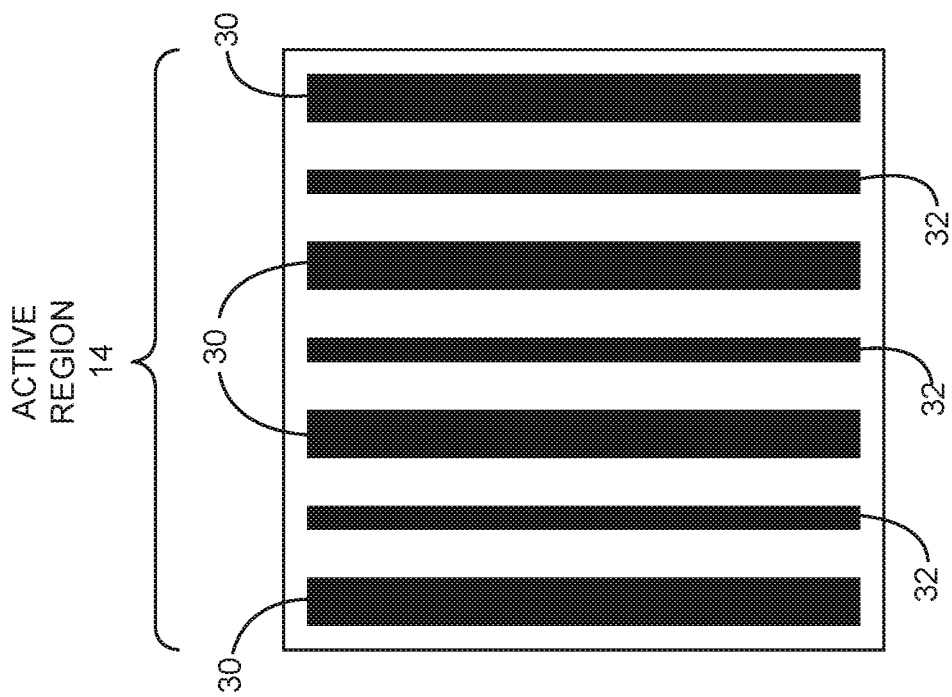
FIG. 2 is a top view of an active region of the Schottky diode, without the Schottky layer and anode contact, according to one embodiment of the disclosure.

The JB elements 30 and central implants 32 may take on various shapes and be laid out in different configurations, as illustrated in FIGS. 2 and 3. As illustrated in FIG. 2, each JB element 30 and central implant 32 is a single, long, elongated stripe that extends substantially across the active region 14, wherein the JB array is a plurality of alternating JB elements 30 and central implants 32. In FIG. 3, each JB element 30 and central implant 32 is a short, elongated dash wherein the JB array has parallel rows of multiple dashes that are linearly aligned to extend across the active region 14. Ohmic elements 30A may be provided along the top surface of the drift layer 22 within the active region 14. The Ohmic elements 30A help increase the ability of the active region 14 to handle current and voltage surges. The Ohmic elements 30A are metal elements that are used to make a good Ohmic contact with the JB elements 30. The Ohmic elements 30A may be formed by existing photo lift-off or metal wet etch techniques.

As described further below, the elongated stripes and the dashes may have substantially the same or substantially different doping concentrations. Other shapes and configurations of the JB elements 30 and central implants for the JB array that is formed therefrom will be appreciated by those skilled in the art after reading the disclosure provide herein.

With continued reference to FIG. 1, the edge termination region 16 that is formed in a portion of the drift layer 22 and completely, or at least substantially, surrounds the active region 14. A guard ring-type termination is provided as an example. Other termination techniques, such as Bevel, Junction Termination Extension (JTE), and the like could be applied as alternatives to the guard ring termination. A recess well 34 is formed by lightly doping a portion of the drift layer 22 that resides below the surface of the drift layer 22 with a P-type material. As such, the recess well 34 is a lightly doped P-type region within the drift layer 22. The recess well 34 may, but need not, extend to or partially into the outer most JB elements 30. Along the surface of the drift layer 22 and within the recess well 34, a plurality of concentric guard rings 36 are formed. The guard rings 36 are formed by heavily doping the corresponding portions of the recess well 34 with a P-type doping material. In select embodiments, the guard rings are spaced apart from one another and extend into the recess well 34 from the top surface of the drift layer 22.

In addition to the guard rings 36 that reside in the recess well 34, a mesa guard ring (not shown) may be provided around the outer periphery of the active region 14. The mesa guard ring is also formed by heavily doping a portion of the drift layer 22 about active region 14, such that the mesa guard ring is formed about the periphery of the active region 14 and extends into the drift layer 22. The recess well 34, the guard rings 36, and the mesa guard ring may be of any shape and will generally correspond to the shape of the periphery of the active region 14, which is rectangular in the illustrated embodiments. Each of these three elements may provide a continuous or broken (i.e. dashed, dotted, or the like) loop about the active region 14.

Figure 4:
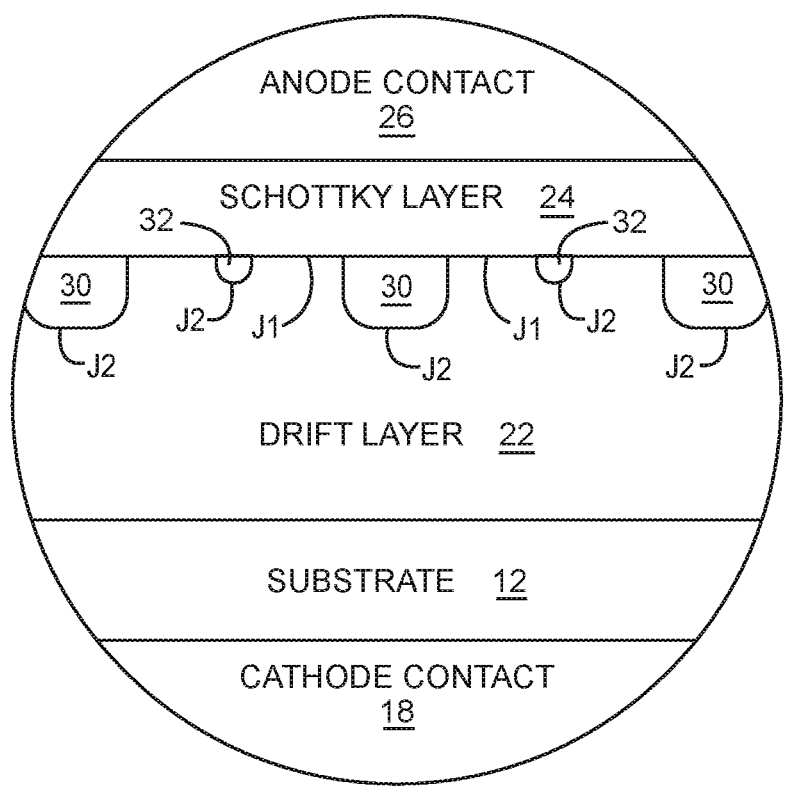
FIG. 4 is a partial cross-sectional view of a Schottky diode according to one embodiment of the disclosure.

In one embodiment, FIG. 4 provides an enlarged view of a portion of the active region 14 and is used to help identify the various p-n junctions that come into play during operation of the Schottky diode 10. For this embodiment, assume the JB elements 30 and central implants 32 are elongated stripes (as illustrated in FIG. 2). With the presence of the JB elements 30 and the central implants 32, there are at least two types of junctions about the active region 14. The first junction type is referred to as a Schottky junction J1, and is any metal-semiconductor (m-s) junction between the Schottky layer 24 and those portions of the top surface of the drift layer 22 that do not have a JB element 30 or central implant 32. In other words, the Schottky junction J1 is a junction between the Schottky layer 24 and the those portions of the top surface of the drift layer that are between a JB element 30 and a central implant 32. The second junction type is referred to as a JB junction J2, and is any p-n junction between the drift layer and either a JB element 30 or central implant 32 that is formed in the drift layer 22.

As the Schottky diode 10 is forward-biased, the Schottky junctions J1 turn on before the JB junctions J2 turn on. At relatively low forward voltages, current transport in the Schottky diode 10 is dominated by majority carriers (electrons) injected across the Schottky junction J1. As such, the Schottky diode 10 acts like a traditional Schottky diode. In this configuration, there is little or no minority carrier injection, and thus no minority charge. As a result the Schottky diode 10 is capable of fast switching speeds at normal operating voltages.

When the Schottky diode 10 is reverse-biased, depletion regions that form adjacent the JB junctions J2 expand to block reverse current through the Schottky diode 10. As a result, the expanded depletion regions function to both protect the Schottky junction J1 and limit reverse leakage current in the Schottky diode 10. With the JB elements 30 and the central implants 32, the Schottky diode 10 behaves like a PIN diode.

In almost any Schottky diode design, there are the basic needs for 1) a low forward-biased resistance, which corresponds to a low forward-biased voltage drop, 2) a low reverse-biased leakage current, and 3) a cost effective design. With regard to cost, the size of the die on which the Schottky diode is fabricated is a significant contributor to the overall cost. As such, there is constant pressure to maintain or increase the performance of the Schottky diode while reducing the size of the die on which the Schottky diode is fabricated.

To decrease the die size while at least maintaining the forward-biased current rating for the Schottky diode, the forward-biased resistance must be reduced. One way to reduce the forward-biased resistance is to increase the doping on the drift layer 22. Unfortunately, increasing the doping in the drift layer 22 has the adverse effect of increasing the reverse-biased leakage current. Thus, there is a need to reduce the reverse-biased leakage current without adversely affecting the forward-biased resistance and voltage drop.

To reduce the reverse-biased leakage current, the electric field in the Schottky interface, which is generally the interface between the drift layer 22 and the Schottky layer 24, should be reduced. The electric field in the Schottky interface is roughly proportional to the reverse-biased leakage current. It has been discovered that the use of the central implants 32 between the JB elements 30 in a JB array as illustrated above significantly reduces the electric field in the Schottky interface relative to a JB array that does not employ central implants 32. Thus, the drift layer 22 may be more highly doped to reduce the forward-biased resistance while having little or no impact on the reverse-biased leakage current when the central implants 32 are employed in the JB array, as illustrated in FIG. 1. As described below in association with FIGS. 5 and 6, additional steps may be taken to even further reduce the electric field in the Schottky interface.

Figure 5:
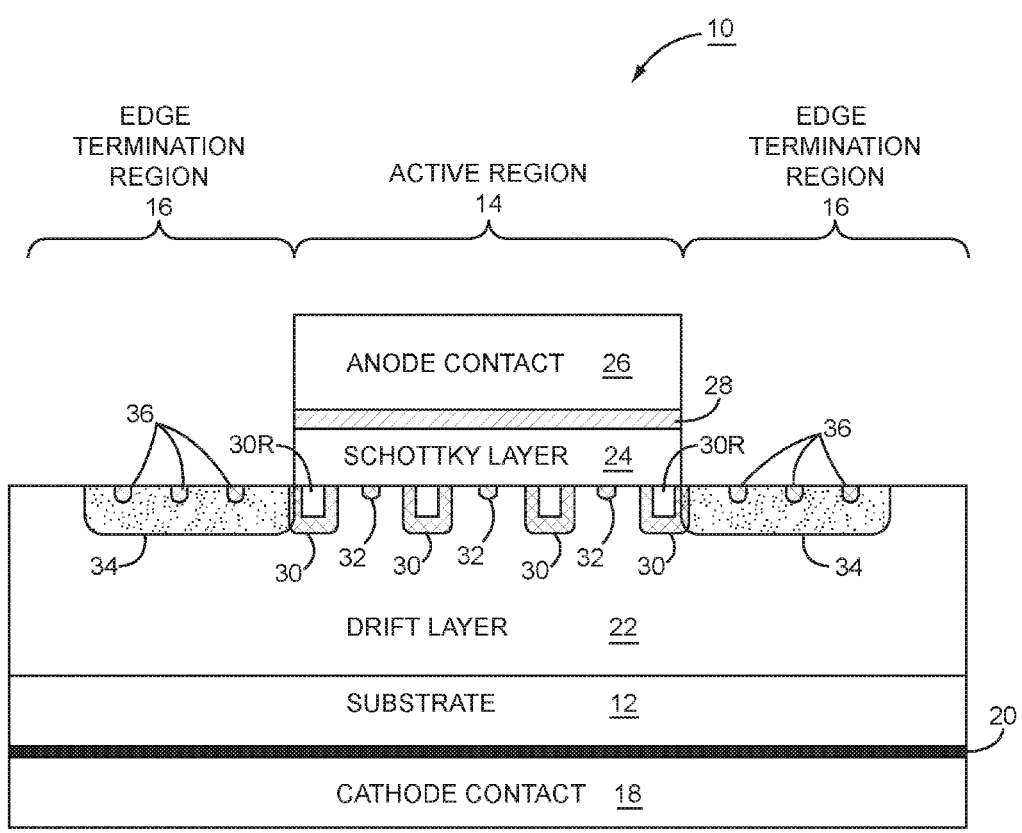
FIG. 5 is a cross-sectional view of a Schottky diode according to a second embodiment of the disclosure.

With reference to FIG. 5, the drift layer 22 and the Schottky layer 24 of Schottky diode 10 are illustrated according to an alternative embodiment. As illustrated, each of the JB elements 30 includes a JB element recess 30R, which is etched into the top surface of the drift layer 22. By etching recesses into the drift layer 22, the respective JB elements 30 may be formed more deeply into the drift layer 22. This is particularly beneficial for SiC devices, wherein the JB element recesses 30R may be formed prior to the selective doping used to form the JB elements 30. The JB element recesses 30R allow deeper doping into the drift layer 22. When describing the width of a particular JB element recess 30R, the width refers to the narrower lateral dimension of a recess having a width, length, and depth. In one embodiment, the depth of any recess is at least 0.8 microns, and the width of any recess is at least 0.8 microns. In another embodiment, the depth of is recesses are at least 2 microns, and the width of any recess is at least 2 microns. Employing the JB element recesses 30R in the JB elements 30 along with the central implants 32 appears to provide a greater electric field reduction in the Schottky interface than simply using the JB elements 30 and central implants 32.

Figure 6:
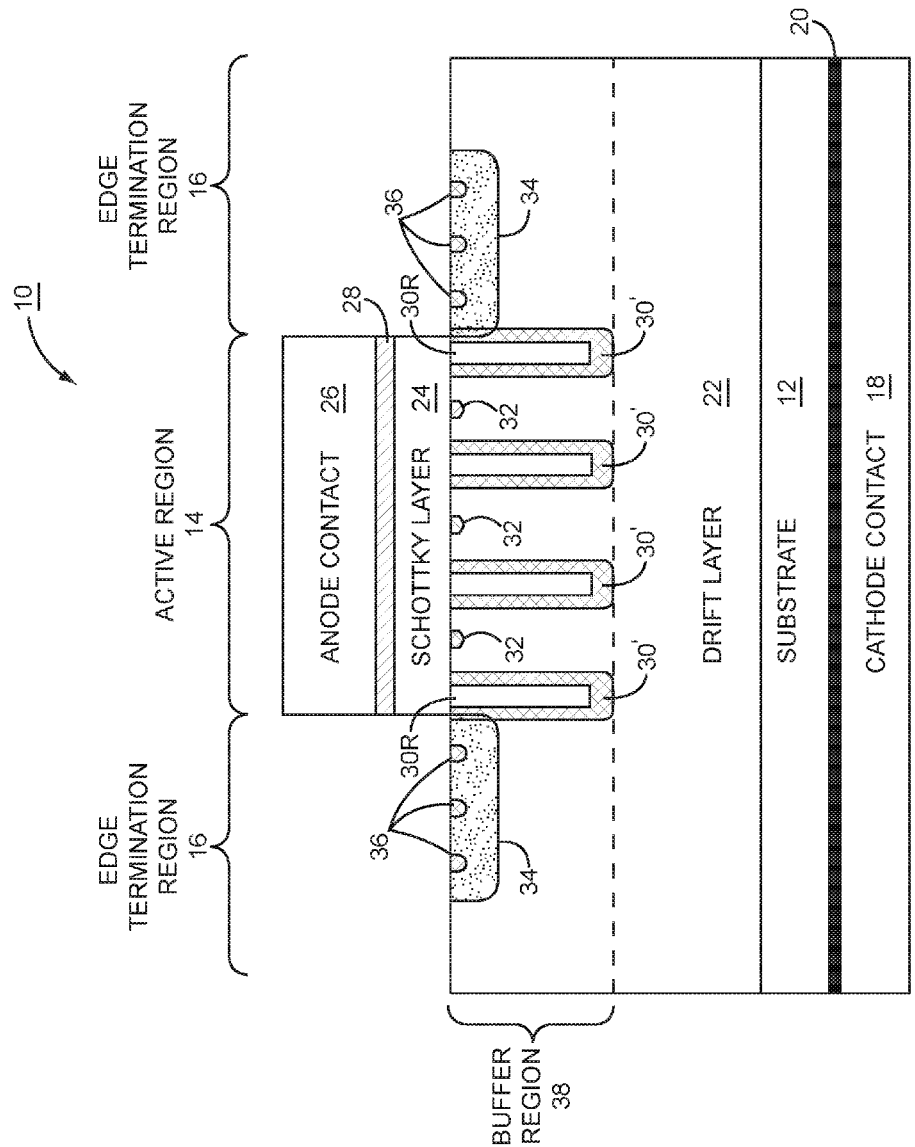
FIG. 6 is a cross-sectional view of a Schottky diode according to a third embodiment of the disclosure.

The embodiment illustrated in FIG. 6 has proven to provide an even greater electric field reduction the Schottky interface. In particular, the Schottky diode 10 is shown with deeply implanted JB elements, which are referred to as deep JB elements 30'. The deep JB elements 30' may include JB element recesses 30R, as depicted. Central implants 32 may be provided between the deep JB elements 30'.

Notably, the drift layer 22 is shown to include a buffer region 38, which is formed along the top portion of the drift layer 22. The buffer region 38 may be more heavily doped than the remainder, or lower portion, of the drift layer 22. The deep JB elements 30' and the central implants 32 are formed in the buffer region 38. In this embodiment, the deep JB elements 30' extend substantially through the buffer region 38 and to, or at least near, the bottom of the buffer region 38.

Figure 7:
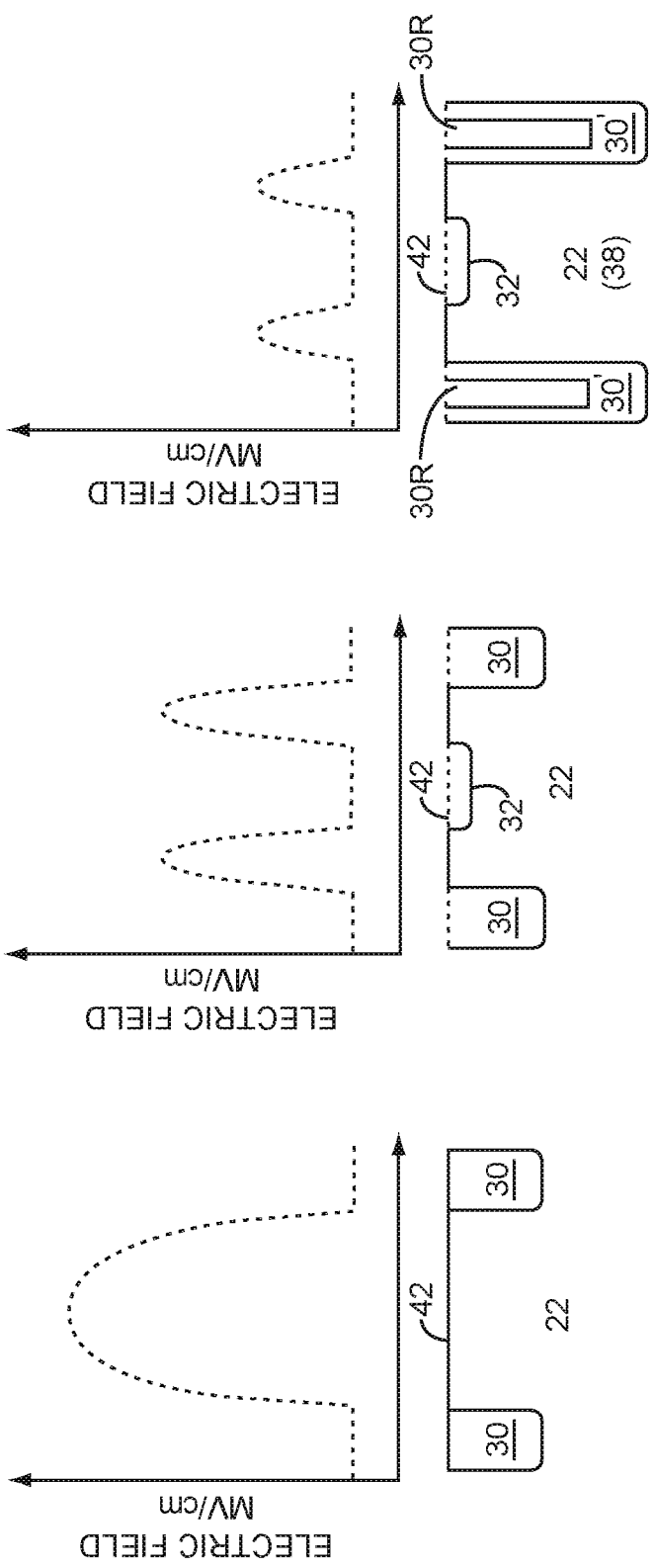
FIGS. 7A, 7B, and 7C are graphs that illustrate the relative electrical field distributions along the Schottky interfaces of three different junction barrier element configurations.

FIGS. 7A, 7B, and 7C are graphs that plot the relative electric field distributions along the Schottky interface 42 for three different JB array configurations. FIG. 7A plots the relative electric field along the Schottky interface 42 for a JB array that only includes JB elements 30. No central implants 32 are provided between the JB elements 30. Along the top surface of each of the two illustrated JB elements 30, the electric field is relatively low. However, the electric field quickly rises to a relatively high level at the midpoint between the two JB elements 30.

FIG. 7B plots the relative electric field along the Schottky interface 42 for a JB array that includes JB elements 30 and interspersed central implants 32, as provide in FIG. 1. Along the top surface of each of the two illustrated JB elements 30 and the central implant 32 provided therebetween, the electric field is relatively low. However, the electric field rises to a relatively low level at the two midpoints between the central implant 32 and each of the JB elements 30.

FIG. 7C plots the relative electric field along the Schottky interface 42 for a JB array that includes deep JB elements 30' and interspersed central implants 32, as provide in FIG. 6. Along the top surface of each of the two deep JB elements 30' and the central implant 32 provided therebetween, the electric field is relatively low. The electric field only rises to a very low level at the two midpoints between the central implant 32 and each of the deep JB elements 30'. These plots clearly depict the significant advantage in using central implants 32 along with JB elements 30 (including deep JB elements 30') in a JB array and the additional benefit in using deep JB elements 30' with JB element recesses 30R.

While the above embodiments are directed to Schottky diodes 10, all of the contemplated structures and designs are equally applicable to other semiconductor devices. Exemplary devices that may benefit from the contemplated structures and designs include all types of field effect transistors (FETs), insulated gate bipolar transistors (IGBTs), and gate turn-off thyristors (GTOs).

Another characteristic that affects both forward and reverse current and voltage characteristics of the Schottky diode 10 is the barrier height associated with the Schottky junction J1 (FIG. 4), which again, is the metal-semiconductor junction between the metal Schottky layer 24 and the semiconductor drift layer 22. When a metal layer, such as the Schottky layer 24, is in close proximity with a semiconductor layer, such as the drift layer 22, a native potential barrier develops between the two layers. The barrier height associated with the Schottky junction J1 corresponds to the native potential barrier. Absent application of an external voltage, this native potential barrier prevents most charge carriers, either electrons or holes, from moving from one layer to another the other. When an external voltage is applied, the native potential barrier from the semiconductor layer's perspective will effectively increase or decrease. Notably, the potential barrier from the metal layer's perspective will not change when the external voltage is applied.

When a Schottky diode 10 with an N-type drift layer 22 is forward biased, application of a positive voltage at the Schottky layer 24 effectively reduces the native potential barrier and causes electrons to flow from the semiconductor across the metal-semiconductor junction. The magnitude of the native potential barrier, and thus barrier height, bears on the amount of voltage necessary to overcome the native potential barrier and cause the electrons to flow from the semiconductor layer to the metal layer. In effect, the potential barrier is reduced when the Schottky diode is forward biased. When the Schottky diode 10 is reverse biased, the potential barrier is greatly increased and functions to block the flow of electrons.

The material used to form the Schottky layer 24 largely dictates the barrier height associated with the Schottky junction J1. In many applications, a low barrier height is preferred. A lower barrier height allows one of the following. First, a lower barrier height device with a smaller active region 14 can be developed to have the same forward turn on and operating current and voltage ratings as a device having a larger active region 14 and a higher barrier height. In other words, the lower barrier height device with a smaller active region 14 can support the same forward voltage at a given current as a device that has a higher barrier height and a larger active region 14. Alternatively, a lower barrier height device may have lower forward turn on and operating voltages while handling the same or similar currents as a higher barrier height device when both devices have active regions 14 of the same size. Lower barrier heights also lower the forward biased on-resistances of the devices, which help make the devices more efficient and generate less heat, which can be destructive to the device.

Exemplary metals (including alloys) that are associated with low barrier heights in Schottky applications that employ a SiC drift layer 22 include, but are not limited to, tantalum (Ta), polysilicon, titanium (Ti), chromium (Cr), and aluminum (Al), where tantalum is associated with the lowest barrier height of the group. The metals are defined as low barrier height cable metals. While the barrier height is a function of the metal used for the Schottky layer 24, the material used for the drift layer 22, and perhaps the extent of doping in the drift layer 22, exemplary barrier heights that may be achieved with certain embodiments are less than 1.2 election volts (eV), less than 1.1 eV, less than 1.0 eV, less than 0.9 eV, and about 0.8 eV.

In select embodiments, the substrate 12 is formed from an N-doped, single crystal, 4H SiC material. The substrate 12 may have various crystalline polytypes, such as 2H, 4H, 6H, 3C and the like. The substrate 12 may also be formed from other material systems, such as gallium nitride (GaN), gallium arsenide (GaAs), silicon (Si), germanium (Ge), SiGe, and the like. The resistivity of the N-doped, SiC substrate 12 is between about 10 milli-ohm·cm and 30 milli-ohm·cm in one embodiment. The initial substrate 12 may have a thickness between about 200 microns and 500 microns. Once the epitaxial structure above the substrate is formed, the back side of the substrate 12 may be thinned prior to forming the cathode contact 18.

The drift layer 22 may be grown over the substrate 12 and doped in situ, wherein the drift layer 22 is doped as it is grown with an N-type doping material. Notably, one or more buffer layers (not shown) may be formed on the substrate 12 prior to forming the drift layer 22. The buffer layer may be used as a nucleation layer and be relatively heavily doped with an N-type doping material. The buffer layer may range from 0.5 to 5 microns in certain embodiments.

The drift layer 22 may be relatively uniformly doped throughout or may employ graded doping throughout all or a portion thereof. For a uniformly doped drift layer 22, the doping concentration may be between about $2 \times 10^{15}$ cm$^{-3}$ and $2 \times 10^{16}$ cm$^{-3}$ in one embodiment. If the buffer region 38 (FIG. 6) is provided, the buffer region is formed by doping the upper portion of the drift layer 22 at a higher level than the bottom portion or portions of the drift layer 22. While different performance metrics may generally necessitate different doping levels and thicknesses, the following Table A provides exemplary doping levels and thicknesses for the overall drift layer 22 and the buffer region 38, which resides in the top portion of the drift layer 22, for a Schottky diode 10 that has a 50 ampere forward-biased current rating at different reverse-biased breakdown voltages.

TABLE A

| Breakdown Voltage | Drift Layer Doping $N_d$ (cm$^{-3}$) | Drift Layer Thickness (microns) | Buffer Region Doping (cm$^{-3}$) | Buffer Region Thickness (microns) |
|---|---|---|---|---|
| 650 V | 8e15-1.5e16 | 4-8 | >2 × $N_d$* | 0.5-2 |
| 1200 V | 7e15-1e16 | 9-14 | >2 × $N_d$* | 0.5-2 |
| 1700 V | 5e15-8e15 | 12-19 | >3 × $N_d$* | 0.5-2 |
| 10 kV | 2e14-5e14 | >100 | >2e16* | 0.5-2 |

*and less than 1e18

The recess well 34 may be formed by lightly implanting select portions of the drift layer 22 with a P-type material. Similarly, the JB elements 30 (or deep JB elements 30'), the central implants 32, and the guard rings 36 may be formed by implanting the corresponding portions of the top surface of the drift layer 22 with a P-type material. The JB elements 30, the central implants 32, and the guard rings 36 are relatively heavily doped and may be formed at the same time using the same ion implantation process. The JB element recesses 30R may be formed prior to implantation to aid in achieving a deeper and more uniform doping concentration for the corresponding JB element 30 (or deep JB elements 30'). In one embodiment, the JB elements 30, central implants 32, and the guard rings 36 are all doped at substantially the same concentrations. Typically, the JB elements 30, central implants 32, and the guard rings 36 are all doped at concentrations of about $1 \times 10^{18}$ cm$^{-3}$ or greater. In other embodiments, these elements may be doped at different concentrations using the same or different ion implantation process, for example, when the JB array includes different shapes or sizes or where the different JB elements 30 have different depths.

The depth and spacing between adjacent JB elements 30, the central implants 32, and the guard rings 36 may vary based on desired device characteristics. In one embodiment, the depth of the central implants 32 may generally range between about 0.2 and 0.6 microns. The width of the central implants 32 may generally range between about 0.9 and 1.6 microns. The depth of the JB elements 30 may generally range between about 0.5 and 5.0 microns. The width of the JB elements 30 may generally range between about 1.5 and 2.0 microns. Each central implant 32 may be spaced apart from an adjacent JB element 30 between about 1.5 to 2.5 microns. In certain embodiments, the depth of a central implant 32 is no greater than about one-half the depth of the JB element 30 (including deep JB elements 30'). In certain embodiments, the depth of the JB elements 30 is about three, four, five or more times the depth of the central implants 32.

For embodiments like those illustrated in FIGS. 5 and 6 that employ JB element recesses 30R, the JB elements 30 are typically more easily formed deeper into the drift layer 22. For a drift layer 22 that is formed from SiC, the depth of the respective recesses may be between about 0.5 and 2 microns and have widths of between about 0.8 and 2 microns.

During fabrication, a thermal oxide layer (not shown) may be formed over the top surface of the drift layer 22. For a SiC drift layer 22, the oxide is silicon dioxide (SiO$_2$). The thermal oxide layer may act as a passivation layer that aids in the protection or performance of the drift layer 22 and the various elements formed therein. A portion of the thermal oxide layer associated with the active region 14 is subsequently removed to form a Schottky recess in which the Schottky layer 24 is formed.

Once the Schottky recess is formed, the Schottky layer 24 is formed over the portion of drift layer 22 that was exposed by the Schottky recess. The thickness of the Schottky layer 24 will vary based on desired device characteristics and the metal used to form the Schottky layer 24, but will generally be between about 100 and 4500 angstroms. For the referenced 650V device, a Schottky layer 24 formed of tantalum (Ta) may be between about 500 and 1500 angstroms; a Schottky layer 24 of polysilicon may be between about 1000 and 5000 angstroms; and a Schottky layer 24 formed of titanium (Ti) may be between about 500 and 2500 angstroms. As noted above, tantalum (Ta) is associated with a low barrier height, especially when used in combination with SiC to form a Schottky junction. Tantalum is also very stable against SiC. Depending on the metal used for the Schottky layer 24 and the to-be-formed anode contact 26, one or more barrier layers 28 may be formed over the Schottky layer 24. The barrier layer 28 may be formed of titanium tungsten alloy (TiW), titanium nickel alloy (TiN), tantalum (Ta), and any other suitable material, and may be between about 100 and 1000 angstroms thick in select embodiments. The barrier layer 28 helps prevent diffusion between the metals used to form the Schottky layer 24 and the to-be-formed anode contact 26. Notably, the barrier layer 28 is not used in certain embodiments where the Schottky layer 24 is tantalum (Ta) and the to-be-formed anode contact 26 is formed from aluminum (Al). The barrier layer 28 is generally beneficial in embodiments where the Schottky layer 24 is titanium (Ti) and the to-be-formed anode contact 26 is formed from aluminum (Al).

The anode contact 26 is formed over the Schottky layer 24, or if present, the barrier layer 28. The anode contact 26 is generally relatively thick, formed from a metal, and acts as a bond pad for the anode of the Schottky diode 10. The anode contact 26 may be formed from aluminum (Al), gold (Au), Silver (Ag), and the like.

As noted above, at the end of fabrication, the substrate 12 may be substantially thinned by removing a bottom portion of the substrate 12 though a grinding, etching, or like process. For the 650V reference Schottky diode 10, the substrate 12 may be thinned to a thickness between about 50 and 200 microns in a first embodiment. Thinning the substrate 12 or otherwise employing a thin substrate 12 reduces the overall electrical and thermal resistance between the anode and cathode of the Schottky diode 10 and allows the device to handle higher current densities without overheating.

The cathode ohmic layer 20 is formed on the bottom of the thinned substrate 12 with an ohmic metal, such as nickel (Ni), nickel silicide (NiSi), and nickel aluminide (NiAl). Once the cathode ohmic layer 20 is formed and annealed, the cathode contact 18 is formed over the cathode ohmic layer 20 to provide a solder or like interface for the Schottky diode 10.

With the concepts disclosed herein, very high performance Schottky diodes 10 may be designed for various applications that require various operation parameters. The current density associated with DC forward biased currents may exceed 500 amperes/cm$^2$ in certain embodiments. In various embodiments, leakage current density has been held below about 5 milliamperes at temperatures above about 125, 150, and 175 Celsius, as well as throughout a range of 150 to 200 Celsius.

Figure 8:
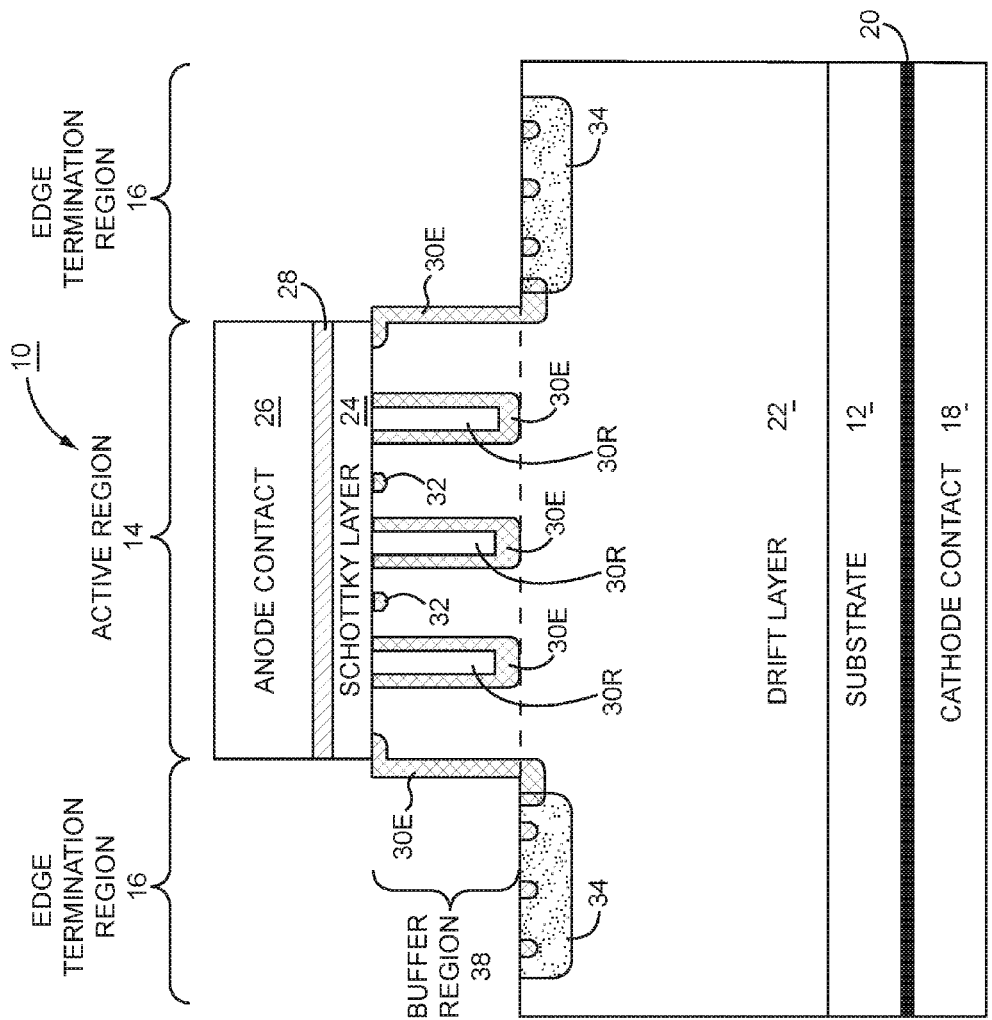
FIG. 8 is a cross-sectional view of a Schottky diode according to a fourth embodiment of the disclosure.

Those skilled in the art will recognize that the concepts discussed above may be implemented in designs that differ from those specifically disclosed herein. For example and with reference to FIG. 8, the Schottky diode 10 may employ an edge termination region 16 that is recessed relative to the active region. For example, the top of the drift layer 22 in the active region 14 is higher than the top of the drift layer 22 in the edge termination region 16. In the embodiment illustrated, substantially all of the buffer region 38 extends above the top surface of those portions of the drift layer 22, which reside in the termination region 16. Those skilled in the art will recognize further improvements and modifications to the embodiments of the present disclosure. All such improvements and modifications are considered within the scope of the concepts disclosed herein and the claims that follow.

What is claimed is:

1. A Schottky diode comprising:
a drift layer predominantly doped with a doping material of a first conductivity type and having a first surface associated with an active region;
a Schottky layer of a low barrier height capable metal provided over the active region of the first surface to form a Schottky junction;
a plurality of junction barrier elements formed in the drift layer below the Schottky junction; and
a plurality of central implants formed in the drift layer below the Schottky junction, wherein
at least one of the plurality of central implants is provided between and spaced apart from adjacent pairs of the plurality of junction barrier elements; and
the first surface of the drift layer comprises a plurality of junction barrier element recesses in the active region such that at least certain junction barrier elements of the plurality of junction barrier elements are doped regions that extend into the drift layer about corresponding ones of the plurality of junction barrier element recesses, and the doped regions are doped with a doping material of a second conductivity type, which is opposite the first conductivity type.

2. The Schottky diode of claim 1 wherein each of the plurality of central implants has no greater than about one-half of a depth of each of the plurality of junction barrier elements.

3. The Schottky diode of claim 2 wherein the active region is substantially surrounded by an edge termination region, which comprises an edge termination structure formed in the drift layer.

4. The Schottky diode of claim 3 wherein the edge termination region includes at least one recess well formed in the drift layer adjacent a junction barrier element of the plurality of junction barrier elements, wherein at least one well region extends into the junction barrier element.

5. The Schottky diode of claim 3 wherein a portion of the drift layer for the edge termination region is recessed relative to the first surface of the active region.

6. The Schottky diode of claim 1 further comprising a buffer region in a top portion of the drift layer wherein the buffer region is doped with the doping material of the first conductivity type at a higher concentration than a remaining lower portion of the drift layer and both the plurality of central implants and the plurality of junction barrier elements reside in the buffer region.

7. The Schottky diode of claim 6 wherein the Schottky junction has a barrier height of less than 0.9 electron volts.

8. The Schottky diode of claim 7 wherein the low barrier height capable metal of the Schottky layer comprises tantalum.

9. The Schottky diode of claim 8 wherein the drift layer comprises silicon carbide.

10. The Schottky diode of claim 1 wherein the low barrier height capable metal of the Schottky layer consists essentially of tantalum.

11. The Schottky diode of claim 1 wherein the low barrier height capable metal of the Schottky layer comprises at least one of a group consisting of titanium, chromium, polysilicon, and aluminum.

12. The Schottky diode of claim 1 wherein a leakage current density is below about 5 milliamperes at temperatures above about 125 Celsius.

13. The Schottky diode of claim 1 wherein a leakage current density is below about 5 milliamperes at temperatures above about 150 Celsius.

14. A Schottky diode comprising:
a drift layer predominantly doped with a doping material of a first conductivity type and having a first surface associated with an active region;
a Schottky layer over the active region of the first surface to form a Schottky junction;
a plurality of central implants formed in the drift layer below the Schottky junction;
a plurality of junction barrier elements formed in the drift layer below the Schottky junction; and at least one recess well formed in the drift layer adjacent a junction barrier element of the plurality of junction barrier elements.

15. The Schottky diode of claim 14 wherein the at least one recess well extends into the junction barrier element.

16. The Schottky diode of claim 14 wherein the at least one recess well includes a concentric guard ring formed therein.

17. The Schottky diode of claim 14 wherein a leakage current density is below about 5 milliamperes at temperatures above about 125 Celsius.

18. The Schottky diode of claim 14 wherein a leakage current density is below about 5 milliamperes at temperatures above about 150 Celsius.

19. The Schottky diode of claim 14 wherein the low barrier height capable metal of the Schottky layer consists essentially of tantalum.

20. The Schottky diode of claim 14 wherein the low barrier height capable metal of the Schottky layer comprises at least one of a group consisting of titanium, chromium, polysilicon, and aluminum.

* * * * *